United States Patent
Nishimura et al.

(10) Patent No.: US 9,543,447 B2
(45) Date of Patent: Jan. 10, 2017

(54) OXYNITRIDE SEMICONDUCTOR THIN FILM

(71) Applicant: SUMITOMO METAL MINING CO., LTD., Tokyo (JP)

(72) Inventors: Eiichiro Nishimura, Tokyo (JP); Tokuyuki Nakayama, Tokyo (JP); Masashi Iwara, Tokyo (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

(21) Appl. No.: 14/773,531

(22) PCT Filed: Mar. 6, 2014

(86) PCT No.: PCT/JP2014/055875
§ 371 (c)(1),
(2) Date: Sep. 8, 2015

(87) PCT Pub. No.: WO2014/136916
PCT Pub. Date: Sep. 12, 2014

(65) Prior Publication Data
US 2016/0020328 A1    Jan. 21, 2016

(30) Foreign Application Priority Data

Mar. 8, 2013 (JP) ................. 2013-047315

(51) Int. Cl.
*H01L 29/786* (2006.01)
*H01L 21/02* (2006.01)
(Continued)

(52) U.S. Cl.
CPC ....... *H01L 29/7869* (2013.01); *C01B 21/0821* (2013.01); *H01L 21/02521* (2013.01);
(Continued)

(58) Field of Classification Search
CPC .............. H01L 21/02565; H01L 29/66969; H01L 29/7869; H01L 21/02667; H01L 21/02521; H01L 21/02554
(Continued)

(56) References Cited

U.S. PATENT DOCUMENTS

2010/0109002 A1    5/2010 Itagaki et al.
2012/0119212 A1    5/2012 Endo et al.
(Continued)

FOREIGN PATENT DOCUMENTS

JP    2008-192721    8/2008
JP    2009-275236    11/2009
(Continued)

OTHER PUBLICATIONS

International Search Report and Written Opinion dated Apr. 15, 2014, from the corresponding PCT/JP2014/055875.
(Continued)

*Primary Examiner* — Kenneth Parker
*Assistant Examiner* — Bo Fan
(74) *Attorney, Agent, or Firm* — Katten Muchin Rosenman LLP

(57) ABSTRACT

The purpose of the present invention is to provide an oxide semiconductor thin film, which has relatively high carrier mobility and is suitable as a channel layer material for a TFT, from an oxynitride crystalline thin film. According to the present invention, a crystalline oxynitride semiconductor thin film is obtained by annealing an amorphous oxynitride semiconductor thin film containing In, O, and N or an amorphous oxynitride semiconductor thin film containing In, O, N, and an additional element M, where M is one or more elements selected from among Zn, Ga, Ti, Si, Ge, Sn,
(Continued)

W, Mg, Al, Y and rare earth elements, at a heating temperature of 200° C. or more for a heating time of 1 minute to 120 minutes.

7 Claims, 1 Drawing Sheet

(51) Int. Cl.
C01B 21/082 (2006.01)
H01L 29/04 (2006.01)
H01L 29/24 (2006.01)
H01L 29/66 (2006.01)

(52) U.S. Cl.
CPC .. *H01L 21/02554* (2013.01); *H01L 21/02565* (2013.01); *H01L 21/02667* (2013.01); *H01L 29/04* (2013.01); *H01L 29/24* (2013.01); *H01L 29/66969* (2013.01); *C01P 2006/40* (2013.01)

(58) Field of Classification Search
USPC ............ 257/43; 423/385; 428/220; 438/104
See application file for complete search history.

(56) References Cited

U.S. PATENT DOCUMENTS

| 2012/0132906 A1 | 5/2012 | Yamazaki |
| 2013/0001557 A1 | 1/2013 | Okazaki et al. |
| 2013/0221351 A1 | 8/2013 | Ebata et al. |

FOREIGN PATENT DOCUMENTS

| JP | 2009275236 A | * | 11/2009 |
| JP | 2010-106291 | | 5/2010 |
| JP | 2010106291 A | * | 5/2010 |
| JP | 2010-219538 | | 9/2010 |
| JP | 2010-251604 | | 11/2010 |
| JP | 2011-58012 | | 3/2011 |
| JP | 2011058012 A | * | 3/2011 |
| JP | 2012-119667 | | 6/2012 |
| JP | 2012-134472 | | 7/2012 |
| JP | 2013-16866 | | 1/2013 |
| JP | 2013-33950 | | 2/2013 |

OTHER PUBLICATIONS

Kazuaki Ebata, et al.; High-Mobility Thin-Film Transistors with Polycrystalline In—Ga—O Channel fabricated by DC Magnetron Sputtering; Applied Physics Express5 (2012) 011); pp. 011102-1 through 011102-3.

* cited by examiner

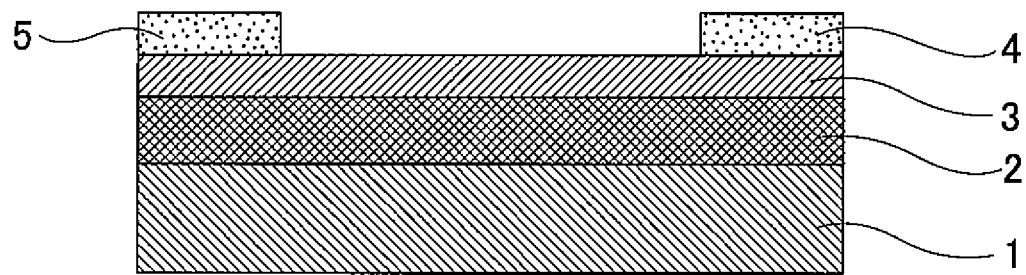

OXYNITRIDE SEMICONDUCTOR THIN FILM

TECHNICAL FIELD

The present invention relates to a thin-film transistor, and particularly to an oxynitride semiconductor thin film as a channel layer material of a thin-film transistor, and the manufacturing method of the oxynitride semiconductor thin film.

BACKGROUND ART

A thin-film transistor (TFT) is a kind of field effect transistor (FET). A TFT is basically a three-terminal element that has a gate terminal, a source terminal, and a drain terminal, and is an active element having a function of using a semiconductor thin film that is formed on a substrate as a channel layer in which electrons or holes migrate, applying a voltage to the gate terminal, controlling the current that flows in the channel layer, and switching the current between the source terminal and the drain terminal. Currently, polycrystalline silicon film or amorphous silicon film is widely used as the channel layer of a TFT.

The amorphous silicon film is capable of being uniformly formed on a 10th-generation glass substrate having a large surface area, and is widely used for the channel layer of a liquid-crystal panel TFT. However, the mobility of carrier electrons (carrier mobility) is a low 1 $cm^2/Vsec$ or less, so application in a high-definition panel TFT is becoming difficult. In other words, as liquid crystals become to have higher definition, there is a need for high-speed driving of a TFT, and in order to achieve high-speed driving of this kind of TFT, it is necessary to use a semiconductor thin film having a carrier mobility that is higher than the 1 $cm^2/Vsec$ carrier mobility of an amorphous film as the channel layer.

On the other hand, the polycrystalline silicon film has a high carrier mobility of about 100 $cm^2/Vsec$, so has sufficient characteristics as channel-layer material for a high-definition panel TFT. However, a polycrystalline silicon film has low carrier mobility at the crystal grain boundaries, so there is a problem in that there is poor uniformity in the surface of the substrate, and variation in the TFT characteristics occurs. Moreover, in the manufacturing process of a polycrystalline silicon film, after forming an amorphous film at a comparatively low temperature of 300° C. or lower, the film is crystallized by an annealing process. This annealing process is a special process that employs excimer laser annealing or the like, so a high running cost is required. In addition, the size of the glass substrate that can be used remains at a 5th-generation size, there is a limit to the reduction in cost, and product development is also limited.

Therefore, currently as material for the channel layer of a TFT, there is a need for a material that has both the excellent characteristics of an amorphous silicon film and a polycrystalline silicon film and that can be obtained a low cost. For example, JP 2010-219538 (A) discloses a transparent amorphous oxide thin film (a-IGZO film) that is formed by a vapor phase film formation method, has In (indium), Ga (gallium), An (zinc), and O (oxygen) without added impurity ions, and has a carrier mobility that is higher than 1 $cm^2/Vsec$, and a carrier density that is $10^{16}/cm^3$ or less.

However, even though the a-IGZO film disclosed in JP 2010-219538 (A) that is formed by a vapor phase film formation method such as a sputtering method or pulse laser vapor deposition method has a comparatively high carrier mobility within the range 1 $cm^2/Vsec$ to 10 $cm^2/Vsec$, an amorphous oxide thin film inherently has problems in that oxygen deficiency easily occurs, and operation of a device such as a TFT sometimes becomes unstable because of the fact that the behavior of the carrier electrons is not always stable due to external factors such as heat.

Furthermore, the occurrence of a phenomenon in which the threshold voltage will shift to the negative side when a negative bias is continuously applied to a TFT element under visible-light irradiation (light negative bias degradation phenomenon), which is unique to amorphous film, is identified as a serious problem for use in displays such as a liquid-crystal display.

On the other hand, JP 2008-192721 (A) discloses an $In_2O_3$ (indium oxide) film that is doped with Sn (tin), Ti (titanium) or W (tungsten), or a $In_2O_3$ film that is doped with W, Zn and/or Sn with the object of obtaining a thin-film transistor that is low cost and is able to achieve both high performance and high reliability, and that can be used for manufacturing elements for a polymeric material that does not require high-temperature processing. According to JP 2008-192721 (A), by using these amorphous $In_2O_3$ films for a channel layer, it is possible to make the carrier mobility of a TFT element 5 $cm^2/Vsec$ or greater.

Moreover, JP 2010-251604 (A) discloses an amorphous $In_2O_3$ film that is obtained by forming a film using a no-heating sputtering method with an $In_2O_3$ sintered compact that is doped with one or two or more elements selected from among Sn, Ti, W, and Zn as a target, and then performing heat treatment for 10 minutes to 120 minutes at 150° C. to 300° C. According to JP 2010-251604 (A), by performing this kind of heat treatment, it is possible to obtain a very stable $In_2O_3$ film through comparatively simple control while maintaining the characteristic of having both high carrier mobility and an amorphous nature.

Furthermore, in JP 2011-58012 (A) discloses an amorphous $In_2O_3$ film having excellent stability that includes In, Ga, Zn, O, and N (nitrogen), and is controlled so that the concentration of N is no less than $1 \times 10^{20}$ atom/cc and no more than $1 \times 10^{22}$ atom/cc.

However, the $In_2O_3$ films that are disclosed in the cited literature above are amorphous films, so basically problems such as the easy occurrence of oxygen deficiency, the films becoming unstable due to external factors such as heat, or the problem of the occurrence of the light negative bias degradation phenomenon cannot be solved. Moreover, in considering use as a channel-layer material for a high-definition panel TFT, achieving even higher carrier mobility is desired.

On the other hand, "Applied Physics Express 5 (2012) 011)" discloses an $In_2O_3$ film doped with Ga that is obtained by forming an amorphous film using a sputtering method with an $In_2O_3$ sintered compact doped with Ga as a target, and then crystallizing the film by performing heat treatment for 1 hour at 300° C. Even though this film has high carrier mobility, controlling oxygen deficiency is difficult, and the carrier density become a high $1 \times 10^{17}$ $cm^{-3}$, so it is difficult to obtain a TFT element having stable characteristics.

Moreover, JP 2009-275236 (A) discloses an oxynitride semiconductor thin film that includes added elements such as Zn and an added elements such as In or Ga, the atomic composition ratio of N that is represented by N/(N+0) is 7 atomic % or greater but less than 100 atomic %. This oxynitride semiconductor thin film can be formed by introducing source gas that includes N (nitrogen) in the gaseous phase, or irradiating a N radical using a radical source, then forming a film using a sputtering method or vapor deposition method, and further arbitrarily performing heat treatment at a temperature of 150° C. to 450° C. after film formation.

According to JP 2009-275236 (A), this oxynitride semiconductor thin film has a hexagonal crystal structure, high carrier mobility of 10 cm$^2$/Vsec to 30 cm$^2$/Vsec, and excellent stability. However, the carrier density is high at about $1\times10^{18}$ cm$^{-3}$.

RELATED LITERATURE

Patent Literature

| [Patent Literature 1] | JP 2010-219538 (A) |
| [Patent Literature 2] | JP 2008-192721 (A) |
| [Patent Literature 3] | JP 2010-251604 (A) |
| [Patent Literature 4] | JP 2011-58012 (A) |
| [Patent Literature 5] | JP 2009-275236 (A) |

Non-Patent Literature

[Non-patent Literature 1] Applied Physics Express 5 (2012) 011

SUMMARY OF INVENTION

Problem to be Solved by Invention

The object of the present invention is to provide by way of a oxynitride crystalline thin film, a semiconductor thin film that eliminates the problems of silicon semiconductor thin films and oxide semiconductor thin films, has a low carrier density and high carrier mobility, and is suitable for use as channel-layer material for a thin-film transistor (TFT).

Means for Solving Problems

The oxynitride semiconductor thin film of the present invention comprises a crystalline oxynitride semiconductor that includes In, O and N, or comprises a crystalline oxynitride semiconductor that includes In, O, N, and added element M (where M is one or more element selected from among Zn, Ga, Ti, Si, Ge, Sn, W, Mg, Al, Y and rare-earth elements), and has a carrier density of $1\times10^{17}$ cm$^{-3}$ or less, and carrier mobility of 5 cm$^2$/Vsec or more.

Preferably, the amount of N included in the oxynitride semiconductor is $3\times10^{20}$ atoms/cm$^3$ or more but less than $1\times10^{22}$ atoms/cm$^3$.

Preferably, the crystal structure of the oxynitride semiconductor comprises $In_2O_3$ having Bixbyite structure, and N atoms are solid-soluted in the $In_2O_3$ phase.

Preferably, the amount of added element M included in terms of atomic ratio M/(In+M) is greater than 0 but no greater than 0.20.

Preferably, the carrier mobility is 15 cm$^2$/Vsec or greater, and more preferably, 25 cm$^2$/Vsec or greater.

Preferably, the film thickness is 15 nm to 200 nm, and more preferably, 40 nm to 100 nm.

The crystalline oxynitride semiconductor thin film of the present invention can be obtained by performing an annealing process at a heating temperature of 200° C. or greater, and heating time of 1 minute to 120 minutes on an amorphous oxynitride semiconductor thin film that includes In, O, and N, or an amorphous oxynitride semiconductor thin film that includes In, O, N, and added element M, where M is one ore more element selected from among Zn, Ga, Ti, Si, Ge, Sn, W, Mg, Al, Y, and rare-earth elements.

The thin-film transistor of the present invention comprises a source electrode, a drain electrode, a gate electrode, a channel layer, and a gate insulation film, in which the channel layer comprises the oxynitride semiconductor thin film of the present invention.

Effect of Invention

The oxynitride semiconductor thin film of the present invention is an oxynitride crystalline thin film having a low carrier density of $1\times10^{17}$ cm$^{-3}$ or less, and a high carrier mobility of 5 cm$^2$/Vsec or more. In addition, the oxynitride semiconductor thin film of the present invention does not have the defects of a conventional oxide semiconductor thin film, and particularly does not have the defect of easily occurring oxygen deficiency, is not unstable against external factors such as heat, and does not have the defect of easily occurring light negative bias degradation phenomenon, which were problems with amorphous oxide semiconductor thin film.

Moreover, with the present invention, amorphous thin film comprising oxynitride having a specified composition can be converted to a crystalline oxynitride thin film having high crystallinity by performing an annealing process at 400° C. or less.

Furthermore, by using the oxynitride semiconductor thin film of the present invention as channel-layer material, it is possible to improve the TFT characteristics at low cost. Therefore, the present invention is extremely useful industrially.

BRIEF DESCRIPTION OF DRAWINGS

FIG. 1 is a cross-sectional schematic view of a TFT element of the present invention.

MODES FOR CARRYING OUT INVENTION

The inventors diligently studied alternative materials for an oxide semiconductor thin film. More specifically, many experiments were performed for forming a crystalline oxynitride semiconductor thin film by performing an annealing process on an oxynitride semiconductor thin film that was obtained by a sputtering method and having In as the main component. When doing this, detailed study was performed for conditions for achieving a crystalline oxynitride semiconductor thin film having high carrier mobility and suppressed carrier density. As a result, the inventors learned that a crystalline oxynitride semiconductor thin film that is obtained by performing an annealing process under specified conditions on an amorphous oxynitride semiconductor thin film to which In, O and N, or specified additional element has been added has a low carrier density of $1\times10^{17}$ cm$^{-3}$ while having a high carrier density of 5 cm$^2$/Vsec, and can be suitably used as channel-layer material for a thin-film transistor (TFT). The present invention was achieved based on this knowledge.

In the following, the oxynitride semiconductor thin film and the thin-film transistor (TFT) that uses this oxynitride semiconductor thin film as a channel-layer material will be explained in detail.

1. Oxynitride Semiconductor Thin Film (1) Composition

The oxynitride semiconductor thin film of the present invention comprises an oxynitride semiconductor thin film that includes In, O, and N, and an addition element(s) in addition to these.

Typically, a crystalline oxide semiconductor thin film having In as the main component is such that oxygen deficiency occurs easily, and since this oxygen deficiency is the main carrier, there is a tendency for the carrier density to become high. However, in the present invention, an oxynitride semiconductor thin film is formed by adding N, and the holes that are generated by N behaving as an acceptor neutralizes the electrons that become carriers that occurred due to oxygen deficiency, so it becomes possible to suppress the carrier density.

The amount of N included in the oxynitride semiconductor thin film is $3 \times 10^{20}$ atoms/cm$^3$ or greater but less than $1 \times 10^{22}$ atoms/cm$^3$, and preferably is no less than $5 \times 10^{20}$ atoms/cm$^3$ and no greater than $8 \times 10^{21}$ atoms/cm$^3$, and more preferably is no less than $8 \times 10^{20}$ atoms/cm$^3$ and no greater than $6 \times 10^{21}$ atoms/cm$^3$. When the amount of N included is less than $3 \times 10^{20}$ atoms/cm$^3$, it is not possible to sufficiently obtain the effect above. On the other hand, even when the amount of N included is $1 \times 10^{22}$ atoms/cm$^3$ or greater, more effect cannot be expected. Moreover, the crystallization temperature becomes too high, so even though an annealing process is performed at a temperature of 400° C. or greater, it becomes difficult to obtain a crystalline oxide semiconductor thin film.

The oxynitride semiconductor thin film of the present invention, in addition to In, O, and N, can also include an additional element(s) whose function becomes dominant in keeping the carrier mobility from decreasing, and suppressing the occurrence of oxygen deficiency without the carrier density as a carrier source becoming higher than necessary. More specifically, it is possible to include one or more element selected from among Zn, Ga, Ti, Si (silicon), Ge (germanium), Sn, W, Mg (magnesium), Al (aluminum), Y (yttrium), and rare-earth elements represented by La (lanthanum) and Sc (scandium). In the case of rare-earth elements, it is difficult for trivalent elements represented by La, Sc or the like to become a factor for ionized impurity scattering, so can be suitably used as additional elements.

When including additional elements M, the amount included, in terms of the atomic ratio M/(In+M), is preferably greater than 0 but not greater than 0.20, and more preferably is no less than 0.05 and no greater than 0.15, and even more preferably is no less than 0.08 and no greater than 0.12. When the amount of M included in terms of M/(In+M) is greater than 0.20, the ratio of In included in the oxynitride semiconductor thin film decreases, and it is not possible to make the carrier mobility 5 cm$^2$/Vsec or greater. However, when Zn is used as the additional element M, it becomes easy for the crystal structure to become a hexagonal crystal structure, so the amount included is preferably 0.10 or less, and more preferably 0.05 or less.

(2) Crystal Structure

In the oxynitride semiconductor thin film of the present invention, as long as the structure is crystalline, the crystal structure is not particularly limited, however, preferably the structure comprises the In$_2$O$_3$ phase of Bixbyite structure, and the N atoms are solid-soluted in the In$_2$O$_3$ phase. Particularly, it is preferred that all or part of the N atoms are substituted for the oxygen sites in the In$_2$O$_3$ phase, or that all or part of the N atoms penetrate in between the In$_2$O$_3$ crystal lattice. In the In$_2$O$_3$ phase of Bixbyite structure, InO$_6$ octahedron structure comprising In and O is formed, and due to the sharing of edges of adjacent InO$_6$ octahedron structures, the distance between In—In becomes short, and the overlap of orbiting carrier electrons becomes large. Therefore, by making the oxynitride semiconductor thin film comprise this kind of crystal structure, it is possible to improve the carrier mobility.

Here, comprising In$_2$O$_3$ phase Bixbyite structure not only includes the case of comprising only In$_2$O$_3$ phase Bixbyite structure, but also includes the case of a heterogeneous phase existing in addition to the Bixbyite structure In$_2$O$_3$ phase within a range such that the crystal structure does not break apart. The crystal structure of the oxynitride semiconductor thin film can be identified by x-ray diffraction measurement.

(3) Film Thickness

The film thickness of the oxynitride semiconductor thin film of the present invention is preferably regulated to be within the range 15 nm to 200 nm, and more preferably 30 nm to 150 nm, and even more preferably 40 nm to 100 nm. The film thickness can be measured by a profilometer.

Typically, a semiconductor thin film is often formed on a glass substrate. In other words, a crystalline oxynitride semiconductor thin film is formed on an amorphous substrate. Therefore, in the case of the oxynitride semiconductor thin film of the present invention, when the film thickness is less than 15 nm, it is possible that due to the effect of the substrate, the precursor oxynitride amorphous thin film will not crystallize even though an annealing process is performed at a high temperature of 400° C. Even when presuming that it is possible to crystallize this oxynitride amorphous thin film, it is difficult to make the crystallinity sufficient. The effect that an amorphous substrate has on the crystallinity of an oxynitride semiconductor can be further reduced by making the film thickness 30 nm or greater, however, it is possible to stably eliminate that effect by making the film thickness 40 nm or greater. However, when taking cost into consideration, the upper limit value for the film thickness is preferably 200 nm or less, and more preferably 150 nm or less, and even more preferably 100 nm or less.

Moreover, when an oxynitride semiconductor thin film is formed on a glass substrate by controlling the film thickness to be in close to 100 nm, it is possible to expect an improvement in the transmittance of blue light due to optical interference. Therefore, when applying the oxynitride semiconductor thin film of the present invention to a transparent TFT, preferably the film thickness is adjusted to be close to 100 nm.

(4) Characteristics

The oxynitride semiconductor thin film of the present invention is crystalline, and comprises an oxynitride including In, O, and N, or including In, O, N, and additional elements M. Therefore, the TFT elements to which the oxynitride semiconductor thin film of the present invention is applied has high stability against external factors such as heat, and does not have defects such as the occurrence of the light negative bias degradation phenomenon.

In the oxynitride semiconductor thin film of the present invention, it is necessary to perform control so that the carrier density is $1 \times 10^{17}$ cm$^{-3}$ or less, and preferably $8 \times 10^{16}$ cm$^{-3}$, and more preferably $5 \times 10^{16}$ cm$^{-3}$ or less. When the carrier density is greater than $1 \times 10^{17}$ cm$^{-3}$, it becomes difficult to achieve a high ON/OFF ratio, so it is not possible to apply this material as a TFT channel-layer material that requires high-speed driving. Here, the ON/OFF ratio means the ratio of the current value between the conducting state and the blocked state.

On the other hand, it is necessary to perform control so that the carrier mobility is 5 cm$^2$/Vsec or greater. When the carrier mobility is less than 5 cm$^2$/Vsec, it is difficult to maintain the high pixel control performance of a TFT.

Particularly, taking into consideration application in a high-definition liquid-crystal panel TFT, it is necessary that the carrier mobility preferably be 15 $cm^2$/Vsec or greater, and more preferably 25 $cm^2$/Vsec or greater.

The carrier density and carrier mobility can be found by measuring the Hall effect of an oxynitride semiconductor thin film using a Hall effect measuring device.

The oxynitride semiconductor thin film of the present invention is controlled in this way so that the carrier density and carrier mobility are within the ranges above, so not only is it possible to use this thin film as a channel layer material that requires a carrier density that is 2 to 4 digits lower than an oxide transparent conductive film, but it is also possible to maintain the high pixel control performance of a TFT due to the high carrier mobility.

Moreover, the oxynitride semiconductor thin film of the present invention is such that by using wet etching or dry etching, it is possible to simplify the fine processing required for use in a TFT or the like. For example, in the case of manufacturing the oxynitride semiconductor thin film of the present invention by first forming an amorphous film, and then crystallizing the oxynitride semiconductor thin film by performing an annealing process at the crystallization temperature or higher, it is possible to perform processing by wet etching that uses a weak acid after forming the amorphous film. In this case, as long as the acid is a weak acid, the acid is not particularly limited, however, preferably the weak acid has oxalic acid as the main component. More specifically, it is possible to use a transparent conductive film etching liquid (ITO-06N) manufactured by Kanto Chemical Co., Ltd. or like. On the other hand, in the case of dry etching, it is possible to perform processing using a suitable etching gas on the oxynitride semiconductor thin film.

2. Manufacturing Method for an Oxynitride Semiconductor Thin Film

As was described above, the oxynitride semiconductor thin film of the present invention must be crystalline. As methods for obtaining this kind of crystalline thin film, there is a method in which a film is formed with the substrate temperature during film formation being the crystallization temperature or greater, and there is a method in which after an amorphous film is formed at a temperature less than the crystallization temperature, crystallization is performed by annealing or the like. In the present invention, it is possible to use either method, however, by performing an annealing process on an amorphous film, it is possible to efficiently eliminate oxygen deficiency, so from the aspect of obtaining a low carrier density, employing the latter method is advantageous. Therefore, in the following, the manufacturing method for manufacturing the oxynitride semiconductor thin film of the present invention will be explained for the case of using the latter method.

(1) Film Formation Process
(Substrate)

As the substrate on which the oxynitride semiconductor thin film of the present invention will be formed, it is possible to use a glass substrate, or a substrate for a semiconductor device such as a Si (silicon) substrate or the like. Moreover, even when the substrate is a substrate other than these, as long as the substrate is able to withstand the temperature during the annealing process during film formation, it is possible to use a resin board or resin film.

(Raw Material)

As the raw material, it is possible to use sintered oxide or sintered oxynitride. However, when using a sintered oxide for the raw material, it is necessary that N be included in the atmosphere during film formation, which will be explained later.

The composition ratios of the metal elements of the sintered oxide or sintered oxynitride raw material can be suitably set according to the film formation conditions, however, normally, it is preferred that the composition ratios be the same as the composition ratios of the metal elements of the target oxynitride semiconductor thin film.

(Film Formation Method)

The method for forming the oxynitride semiconductor thin film of the present invention is not particularly limited, and it is possible to use a sputtering method, ion-plating method, epitaxial growth method or the like. Of these, using a direct-current sputtering method that is not affected much by heat during film formation, and that is capable of high-speed film formation is preferred.

For example, when forming an oxynitride semiconductor thin film by a sputtering method, the pressure inside the chamber of the sputtering device is set to $2 \times 10^{-4}$ Pa by vacuum evacuation, after which, a gas mixture of Ar (argon), $O_2$ and $N_2$ is introduced, and together with adjusting the gas pressure to 0.1 Pa to 1 Pa, and preferably 0.2 Pa to 0.8 Pa, and more preferably 0.2 Pa to 0.5 Pa, the distance between the target and substrate is adjusted to 10 mm to 100 mm, and preferably 40 mm to 70 mm. Next, direct-current plasma is generated by applying direct-current electric power so that the direct-current electric power with respect to the target surface area, or in other words the direct-current electric power density is within the range 1 $W/cm^2$ to 3 $W/cm^2$, and after performing pre-sputtering for 5 minutes to 30 minutes, the substrate position is corrected as necessary and sputtering is performed under the same conditions.

The substrate temperature during film formation is preferably 200° C. or less when the film thickness is within the range 15 nm to 70 nm, and is preferably 100° C. or less when the film thickness is within the range 70 nm to 200 nm. In either case, the temperature is more preferably within the range from room temperature to 100° C.

As the sputtering gas, when sintered oxynitride is used as the target, a gas mixture comprising an inert gas and $O_2$ is used, and preferably a gas mixture comprising Ar and $O_2$ is used. On the other hand, when sintered oxide is used as the target, a gas mixture comprising an inert gas, $O_2$ and $N_2$ is used, and preferably a gas mixture comprising Ar, $O_2$, and $N_2$ is used.

The $O_2$ concentration in the sputtering gas must be suitably adjusted according to the sputtering conditions and particularly according to the direct-current electric power density. For example, when performing sputtering by controlling the direct-current electric power to be within the range 1 $W/cm^2$ to 3 $W/cm^2$, the $O_2$ concentration is preferably 0.1% by volume to 10% by volume, and more preferably 0.5% by volume to 8.0% by volume, and even more preferably 1.0% by volume to 5.0% by volume. When the $O_2$ concentration is less the 0.1% by volume, oxygen deficiency occurs, and there is a possibility that the carrier density will increase. On the other hand, when the $O_2$ concentration is greater than 10% by volume, the speed of film formation greatly drops.

As the sputtering gas, when a gas mixture comprising an inert gas, $O_2$, and $N_2$ is used, the $N_2$ concentration in the sputtering gas must similarly be suitably adjusted according to the sputtering conditions such as the direct-current electric power. For example, when performing sputtering by controlling the direct-current electric power to be within the range above, the $N_2$ concentration is preferably controlled to be no less than 0.4% by volume but less than 6.0% by volume, and preferably no less than 0.5% by volume and no greater than 5.7% by volume, and even more preferably no less than 1.0% by volume and no greater than 5.0% by volume. When the $N_2$ concentration is less than 0.4% by volume, it may not be possible to obtain an oxynitride semiconductor thin film in which a sufficient amount of N is solid-soluted. On the other hand, when the $N_2$ concentration is 6.0% by volume or greater, not only does the speed of film formation greatly decrease, but the crystallization temperature increases due to the increased amount of N that is included in the oxynitride semiconductor thin film, and thus it becomes difficult to obtain a crystalline oxynitride semiconductor thin film even when an annealing process is performed at 400° C. or greater.

(2) Annealing Process

As was described above, in the manufacturing method for an oxynitride semiconductor thin film of the present invention, after forming an amorphous oxynitride semiconductor thin film, it is necessary to crystallize the oxynitride semiconductor thin film by performing an annealing process.

The heating temperature during the annealing process must be 200° C. or greater, and preferably 250° C. or greater, and even more preferably 300° C. or greater. When the heating temperature is less than 200° C., it is not possible to sufficiently crystallize the oxynitride semiconductor thin film. The upper limit for the heating temperature is not particularly limited, however, in consideration of productivity, preferably the temperature is 400° C. or less.

The processing time is taken to be 1 minute to 120 minutes, and preferably 5 minutes to 60 minutes. When the processing time is less than 1 minute, it is not possible to sufficiently crystallize the oxynitride semiconductor thin film that is obtained. On the other hand, when the processing time is greater than 120 minutes, no further effect can be expected, so productivity worsens.

The atmosphere for the annealing process is not limited, however, when the object is to crystallize that film as well as reduce the carrier density, preferably the atmosphere includes $O_2$, and more preferably the $O_2$ concentration is 20% by volume or greater, and even more preferably processing is performed in an air atmosphere.

Preferably, these conditions are suitably adjusted according to the performance of the annealing furnace that is used for the annealing process.

JP 2010-251604 (A) discloses technology in which after a film such as a channel layer is formed by a non-heating sputtering method as described above, excess defects in the amorphous film are reduced while maintaining an amorphous nature by performing an annealing process in an air atmosphere at 150° C. to 300° C. for 10 minutes to 120 minutes. Moreover, in the examples of JP 2010-251604 (A), an annealing process is performed in an air atmosphere at 150° C. for 30 minutes on an In—W—Zn—O film (W=1 wt % to 10 wt %) that was formed with no heating. In other words, the technology that is disclosed in JP 2010-251604 (A) is technology in which by adding a suitable amount of an element(s) that can be solid-soluted in the $In_2O_3$ phase and make it possible to increase the crystallization process, makes it possible to maintain the amorphous nature of the oxynitride semiconductor thin film in an annealing process that is performed in the temperature range above, and this point differs from the present invention.

Moreover, in JP 2009-275236 (A), an amorphous oxynitride semiconductor thin film that was obtained by a sputtering method or a vapor deposition method is converted to a crystalline oxynitride semiconductor thin film having a hexagonal crystal structure and having a crystal grain size that is about the same as the film thickness by performing an annealing process at a temperature of 150° C. to 450° C. In this way, the oxynitride semiconductor thin film disclosed in JP 2009-275236 (A) basically has a hexagonal crystal structure, so the aspects of being easy for oxygen deficiency to occur in the formation process of a thin film having a complex crystal structure, and having a small effect on suppressing the carrier density differ from the present invention.

3. TFT Element

A feature of the thin-film transistor (TFT) of the present invention is that the oxynitride semiconductor thin film of the present invention is applied as channel-layer material. The structure of the TFT is not limited, however, an example of a TFT element that is constructed as illustrated in FIG. 1 is possible.

The TFT element that is illustrated in FIG. 1 is constructed by the oxynitride semiconductor thin film of the present invention, and an Au/Ti layered electrode formed on a $SiO_2$/Si substrate that is formed on the surface of a $SiO_2$ film by thermal oxidation. In this construction, the gate electrode 1 comprises a Si substrate, the gate insulation layer 2 comprises a $SiO_2$ film, the channel layer 3 comprises the oxynitride semiconductor thin film of the present invention, and the source electrode 4 and the drain electrode 5 comprise an Au/Ti layered electrode.

In the TFT element illustrated in FIG. 1, a $SiO_2$/Si substrate was used, however, the substrate is not limited to this, and it is also possible to use a conventional substrate that is used as the substrate for an electronic device that includes a thin-film transistor. For example, in addition to a $SiO_2$/Si substrate or Si substrate, it is possible to use a glass substrate such as a non-alkali glass substrate, quartz glass substrate and the like. Moreover, it is also possible to use a non-transparent heat-resistant polymeric film substrate such as various metal substrates, plastic substrate, polyimide substrate and the like.

The gate electrode 1, in the TFT element in FIG. 1 comprises a Si substrate, however the gate electrode 1 is not limited to this. For example, it is also possible to use a metal thin film of Mo (molybdenum), Al, Ta (tantalum), Ti, Au (gold), Pt (platinum) and the like, an electrically conductive oxide, nitride or oxynitride thin films of these metals, or various thin films of electrically conductive polymeric materials. In the case of a transparent TFT, it is possible to use a transparent electrically conductive film such as an indium tin oxide (ITO) thin film. Furthermore, it is also possible to use an oxynitride semiconductor thin film having the same metal element composition as the oxynitride semiconductor thin film of the present invention as the gate electrode 1. In the case of using any of these materials, the specific resistance of the gate electrode 1 is preferably in the range $1\times10^{-6}$ Ω·cm to $1\times10^{-1}$ Ω·cm, and more preferably in the range $1\times10^{-6}$ Ω·cm to $1\times10^{-3}$ Ω·cm.

For the gate insulation layer 2, it is possible to use a known material such as a metal oxide thin film such as a thin film of $SiO_2$, $Y_2O_3$, $Ta_2O_5$, Hf oxide and the like, a metal nitride thin film such as a SiNx thin film and the like, or an insulating polymeric material such as a polyimide. The specific resistance of the gate insulation layer 2 is preferably in the range $1\times10^6$ Ω·cm to $1\times10^{15}$ Ω·cm, and more preferably in the range $1\times10^{10}$ Ω·cm to $1\times10^{15}$ Ω·cm.

The specific resistance of the channel layer 3 is not particularly limited, however, preferably is controlled to be $10^{-1}$ Ω·cm to $10^6$ Ω·cm, and more preferably is controlled to be 1 Ω·cm to $10^3$ Ω·cm. In the oxynitride semiconductor thin film of the present invention, it is possible to adjust the amount of oxygen deficiency that occurs by selecting the film formation conditions for the sputtering method or ion plating method, and conditions for the crystallization annealing process, so it is possible to comparatively easily control the specific resistance.

As the source electrode 4 and the drain electrode 5, as in the case of the gate electrode 1, it is possible to use a metal thin film of Mo, Al, Ta, Ti, Au, Pt and the like, an electrically conductive oxide, nitride or oxynitride thin films of these metals, or various thin films of electrically conductive polymeric materials. In the case of a transparent TFT, it is possible to use a transparent electrically conductive film such as an ITO film. Furthermore, it is also possible to use a layered film of these thin films. Good electrical conductivity is desired for the source electrode 4 and drain electrode 5. More specifically, the specific resistance of the source electrode 4 and drain electrode 5 is preferably in the range $10^{-6}$ Ω·cm to $10^{-1}$ Ω·cm, and more preferably in the range $10^{-6}$ Ω·cm to $10^{-3}$ Ω·cm.

4. Manufacturing Method for a TFT Element

The manufacturing method for a TFT element of the present invention will be explained by giving an example of a method for performing an annealing process after low-temperature film formation when forming an oxynitride semiconductor thin film.

First, a $SiO_2/Si$ substrate is formed by forming a $SiO_2$ film on the surface of a high-doped n-type Si wafer substrate by thermal oxidation. With this substrate maintained at 100° C. or less, an amorphous oxynitride semiconductor thin film having a specified film thickness is formed on the $SiO_2$ film by a direct-current magnetron sputtering method. The film formation conditions when doing this are the same as the conditions explained in "2. Manufacturing Method for an Oxynitride Semiconductor Thin Film", so an explanation here is omitted. Moreover, when forming this amorphous thin film, it is possible to form an oxynitride semiconductor thin film having a desired channel length and/or channel width by performing film formation after masking, or by performing etching using photolithography or the like after forming the amorphous thin film.

Next, a crystalline oxynitride semiconductor thin film is formed by performing an annealing process on this oxynitride semiconductor thin film. The conditions for this annealing process are also the same as the conditions explained in "2. Manufacturing Method for an Oxynitride Semiconductor Thin Film", so an explanation here will be omitted.

After that, the TFT element of the present invention can be obtained by performing masking on the obtained crystalline oxynitride semiconductor thin film (channel layer), and forming the source electrode and drain electrode by sequentially layering a 5 nm thick Ti film and a 100 nm thick Au film. Formation of the source electrode and the drain electrode, is the same as formation of the channel layer, and can be performed by employing a method of performing etching using photolithography or the like after formation of the Ti thin film and Au thin film.

EXAMPLES

In the following, the present invention will be explained in further detail by using some examples, however the present invention is not limited by these examples.

Example 1

An oxynitride semiconductor thin film was formed by using an $In_2O_3$ sintered oxide compact comprising only the $In_2O_3$ phase as a sputtering target.

First, this sputtering target was attached to a cathode for a non-magnetic target of a direct-current magnetron sputtering device (SPK503, manufactured by Tokki Corp.) having no arcing restraint function. Moreover, a non-alkaline glass substrate (EAGLE XG, manufactured by Corning Inc.) was used for the substrate. The distance between the target and substrate was fixed at 60 mm, and after performing vacuum evacuation to $2\times10^{-4}$ Pa or less, a gas mixture comprising Ar, $O_2$ and $N_2$ was mixed in so that the $O_2$ concentration was 1.5% by volume, and the $N_2$ concentration was 1.5% by volume, and the gas pressure was adjusted to 0.6 Pa.

After that, film formation was performed by applying direct-current electric power of 300 W (1.64 W/cm$^2$) to generate direct-current plasma. More specifically, after performing pre-sputtering for 10 minutes, the substrate was placed at a stationary position facing the sputtering target, and sputtering was performed without heating the substrate. As a result, a 50 nm thick oxynitride semiconductor thin film was formed. The composition of the metal component included in the obtained oxynitride semiconductor thin film was measured by ICP atomic emission spectrometry using an ICP atomic emission spectrometry device (SPS3520UV, manufactured by Hitachi High-Tech Science Corporation), and as a result, it was confirmed that the composition was nearly the same as that of the sintered oxide compact. Moreover, the crystal structure of the oxynitride semiconductor thin film was measured by x-ray diffraction using an x-ray diffraction device (X'PertPRO MPD, manufactured by Panalytical), and as a result, it was confirmed that this oxynitride semiconductor thin film was amorphous.

Next, an annealing process was performed on this oxynitride semiconductor thin film in an air atmosphere for 30 minutes at 300° C. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed using a secondary ion mass spectrometry device (PHI ADEPT1010, manufactured by ULVAC-PHI, Inc.), and as a result, it was confirmed that this oxynitride semiconductor thin film included N at about $8\times10^{20}$ atoms/cm$^3$. The secondary ion spectrometry measurement was performed using a reference sample in which N ions were implanted in $In_2O_3$ thin film. From these results, it was understood that in the oxynitride semiconductor thin film of this example, N was solid-soluted in the $In_2O_3$ phase.

After that, the thickness of the obtained oxynitride thin film was measured using a profilometer (Alpha-Step IQ, manufactured by KLA-Tencor Corporation), and as a result, the thickness was confirmed to be 50 nm. Moreover, the Hall effect of the obtained oxynitride semiconductor thin film was measured using a Hall effect measurement device (ResiTest 8400, manufactured by TOYO Corporation), and as a result, it was confirmed that the carrier density was $5\times10^{16}$ cm$^{-3}$, and the carrier mobility was 29 cm$^2$/Vsec.

Example 2

Except for performing the annealing process in an air atmosphere for 30 minutes at 400° C., the oxynitride semiconductor thin film was obtained in the same was as in Example 1.

The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed using a secondary ion mass spectrometry device, and as a result, it was confirmed that this oxynitride semiconductor thin film included N at about $8 \times 10^{20}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $2 \times 10^{16}$ cm$^{-3}$, and the carrier mobility was 30 cm$^2$/Vsec.

Example 3

Except for the $O_2$ concentration in the sputtering gas being 1.4% by volume and the $N_2$ concentration being 5.7% by volume, the oxynitride semiconductor thin film was obtained in the same was as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 1. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed using a secondary ion mass spectrometry device, and as a result, it was confirmed that this oxynitride semiconductor thin film included N at about $5 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $8 \times 10^{15}$ cm$^{-3}$, and the carrier mobility was 27 cm$^2$/Vsec.

Example 4

Except for the $O_2$ concentration in the sputtering gas being 1.4% by volume and the $N_2$ concentration being 5.7% by volume, the oxynitride semiconductor thin film was obtained in the same was as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $5 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $4 \times 10^{15}$ cm$^{-3}$, and the carrier mobility was 30 cm$^2$/Vsec.

Example 5

Except for using a sintered oxide compact that includes Ga in the $In_2O_3$ at an atomic ratio of Ga/(In+Ga) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 1. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $1 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $7 \times 10^{14}$ cm$^{-3}$, and the carrier mobility was 28 cm$^2$/Vsec.

Example 6

Except for using a sintered oxide compact that includes Ga in the $In_2O_3$ at an atomic ratio of Ga/(In+Ga) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $1\times10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $4\times10^{14}$ cm$^{-3}$, and the carrier mobility was 30 cm$^2$/Vsec.

Example 7

Except for the $O_2$ concentration in the sputtering gas being 1.5% by volume and the $N_2$ concentration being 0.5% by volume, the oxynitride semiconductor thin film was obtained in the same was as in Example 5.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $4\times10^{20}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $1\times10^{15}$ cm$^{-3}$, and the carrier mobility was 28 cm$^2$/Vsec.

Example 8

Except for using a sintered oxide compact that includes Ga in the $In_2O_3$ at an atomic ratio of Ga/(In+Ga) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2 except that the time of heat treatment was 120 minutes. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $1\times10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $2\times10^{14}$ cm$^{-3}$, and the carrier mobility was 20 cm$^2$/Vsec.

Example 9

Except for using a sintered oxide compact that includes Ga in the $In_2O_3$ at an atomic ratio of Ga/(In+Ga) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2 except that the time of heat treatment was 60 minutes. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $1\times10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $3\times10^{14}$ cm$^{-3}$, and the carrier mobility was 27 cm$^2$/Vsec.

Example 10

Except for using a sintered oxide compact that includes Ga in the $In_2O_3$ at an atomic ratio of Ga/(In+Ga) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2 except that the time of heat treatment was 5 minutes. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $1 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $6 \times 10^{14}$ cm$^{-3}$, and the carrier mobility was 30 cm$^2$/Vsec.

Example 11

Except for using a sintered oxide compact that includes Ga in the $In_2O_3$ at an atomic ratio of Ga/(In+Ga) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2 except that the time of heat treatment was 1 minute. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $1 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $1 \times 10^{15}$ cm$^{-3}$, and the carrier mobility was 30 cm$^2$/Vsec.

Example 12

Except for the $O_2$ concentration in the sputtering gas being 1.4% by volume and the $N_2$ concentration being 5.7% by volume, the oxynitride semiconductor thin film was obtained in the same was as in Example 5.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 1. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $8 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $6 \times 10^{14}$ cm$^{-3}$, and the carrier mobility was 26 cm$^2$/Vsec.

Example 13

Except for the $O_2$ concentration in the sputtering gas being 1.4% by volume and the $N_2$ concentration being 5.7% by volume, the oxynitride semiconductor thin film was obtained in the same was as in Example 5.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $8 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $3 \times 10^{14}$ cm$^{-3}$, and the carrier mobility was 28 cm$^2$/Vsec.

Example 14

Except for the film thickness being 15 nm, oxynitride semiconductor thin film was obtained in the same was as in Example 5.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $3\times10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 15 nm. Moreover, the Hall effect of the obtained oxynitride semiconductor thin film was measured using a Hall effect measurement device, and as a result, it was confirmed that the carrier density was $6\times10^{14}$ cm$^{-3}$, and the carrier mobility was 26 cm$^2$/Vsec.

Example 15

Except for the film thickness being 200 nm, oxynitride semiconductor thin film was obtained in the same was as in Example 5.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $8\times10^{20}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 200 nm. Moreover, the Hall effect of the obtained oxynitride semiconductor thin film was measured using a Hall effect measurement device, and as a result, it was confirmed that the carrier density was $3\times10^{14}$ cm$^{-3}$, and the carrier mobility was 29 cm$^2$/Vsec.

Example 16

Except for using a sintered oxide compact that includes Ga in the $In_2O_3$ at an atomic ratio of Ga/(In+Ga+Y) of 0.10, and includes Y at an atomic ratio Y/(In+Ga+Y) of 0.05 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $4\times10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $3\times10^{14}$ cm$^{-3}$, and the carrier mobility was 27 cm$^2$/Vsec.

Example 17

Except for using a sintered oxide compact that includes Ga in the $In_2O_3$ at an atomic ratio of Ga/(In+Ga+La) of 0.10, and includes La at an atomic ratio La/(In+Ga+La) of 0.05 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $2\times10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $2\times10^{14}$ cm$^{-3}$, and the carrier mobility was 26 cm$^2$/Vsec.

Example 18

Except for using a sintered oxide compact that includes Ga in the $In_2O_3$ at an atomic ratio of Ga/(In+Ga) of 0.05 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $8 \times 10^{20}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $7 \times 10^{14}$ cm$^{-3}$, and the carrier mobility was 29 cm$^2$/Vsec.

Example 19

Except for using a sintered oxide compact that includes Ga in the $In_2O_3$ at an atomic ratio of Ga/(In+Ga) of 0.08 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $9 \times 10^{20}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $5 \times 10^{14}$ cm$^{-3}$, and the carrier mobility was 29 cm$^2$/Vsec.

Example 20

Except for using a sintered oxide compact that includes Ga in the $In_2O_3$ at an atomic ratio of Ga/(In+Ga) of 0.12 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $2 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $3 \times 10^{14}$ cm$^{-3}$, and the carrier mobility was 27 cm$^2$/Vsec.

Example 21

Except for using a sintered oxide compact that includes Ga in the $In_2O_3$ at an atomic ratio of Ga/(In+Ga) of 0.15 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $3 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $2 \times 10^{14}$ cm$^{-3}$, and the carrier mobility was 26 cm$^2$/Vsec.

Example 22

Except for using a sintered oxide compact that includes Ga in the $In_2O_3$ at an atomic ratio of Ga/(In+Ga) of 0.20 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $4 \times 10^{21}$ atoms/$cm^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $1 \times 10^{14}$ $cm^{-3}$, and the carrier mobility was 25 $cm^2$/Vsec.

Example 23

Except for using a sintered oxide compact that includes Zn in the $In_2O_3$ at an atomic ratio of Zn/(In+Zn) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $9 \times 10^{20}$ atoms/$cm^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $2 \times 10^{15}$ $cm^{-3}$, and the carrier mobility was 12 $cm^2$/Vsec.

Example 24

Except for using a sintered oxide compact that includes Ti in the $In_2O_3$ at an atomic ratio of Ti/(In+Ti) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $2 \times 10^{21}$ atoms/$cm^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $6 \times 10^{14}$ $cm^{-3}$, and the carrier mobility was 8 $cm^2$/Vsec.

Example 25

Except for using a sintered oxide compact that includes W in the $In_2O_3$ at an atomic ratio of W/(In+W) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $9 \times 10^{20}$ atoms/$cm^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $7 \times 10^{14}$ $cm^{-3}$, and the carrier mobility was 10 $cm^2$/Vsec.

Example 26

Except for using a sintered oxide compact that includes Mg in the $In_2O_3$ at an atomic ratio of Mg/(In+Mg) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $9 \times 10^{20}$ atoms/$cm^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $1 \times 10^{15}$ $cm^{-3}$, and the carrier mobility was 8 $cm^2$/Vsec.

Example 27

Except for using a sintered oxide compact that includes Al in the $In_2O_3$ at an atomic ratio of Al/(In+Al) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $3 \times 10^{21}$ atoms/$cm^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $8 \times 10^{14}$ $cm^{-3}$, and the carrier mobility was 22 $cm^2$/Vsec.

Example 28

Except for using a sintered oxide compact that includes Y in the $In_2O_3$ at an atomic ratio of Y/(In+Y) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $3 \times 10^{21}$ atoms/$cm^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $3 \times 10^{15}$ $cm^{-3}$, and the carrier mobility was 20 $cm^2$/Vsec.

Example 29

Except for using a sintered oxide compact that includes La in the $In_2O_3$ at an atomic ratio of La/(In+La) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $2 \times 10^{21}$ atoms/$cm^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $1 \times 10^{15}$ $cm^{-3}$, and the carrier mobility was 18 $cm^2$/Vsec.

Example 30

Except for using a sintered oxide compact that includes Sc in the $In_2O_3$ at an atomic ratio of Sc/(In+Sc) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $2 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $6 \times 10^{15}$ cm$^{-3}$, and the carrier mobility was 17 cm$^2$/Vsec.

Example 31

Except for using a sintered oxide compact that includes Si in the $In_2O_3$ at an atomic ratio of Si/(In+Si) of 0.05 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $4 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $8 \times 10^{16}$ cm$^{-3}$, and the carrier mobility was 29 cm$^2$/Vsec.

Example 32

Except for using a sintered oxide compact that includes Ge in the $In_2O_3$ at an atomic ratio of Ge/(In+Ge) of 0.05 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $2 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $7 \times 10^{16}$ cm$^{-3}$, and the carrier mobility was 31 cm$^2$/Vsec.

Example 33

Except for using a sintered oxide compact that includes Sn in the $In_2O_3$ at an atomic ratio of Sn/(In+Sn) of 0.05 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $2 \times 10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $9 \times 10^{16}$ cm$^{-3}$, and the carrier mobility was 35 cm$^2$/Vsec.

Example 34

Except for performing an annealing process in an air atmosphere for 30 minutes at 200° C., an oxynitride semiconductor thin film was obtained in the same was as in Example 1.

The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $8\times10^{20}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $9\times10^{16}$ cm$^{-3}$, and the carrier mobility was 6 cm$^2$/Vsec.

Example 35

Except for performing an annealing process in an air atmosphere for 30 minutes at 200° C., an oxynitride semiconductor thin film was obtained in the same was as in Example 5.

The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $1\times10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $1\times10^{15}$ cm$^{-3}$, and the carrier mobility was 7 cm$^2$/Vsec.

Comparative Example 1

Except for employing a gas mixture of Ar and $O_2$ as the sputtering gas so that the oxygen concentration became 1.5% by volume, an oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 1. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $2\times10^{20}$ atoms/cm$^3$. From these results, it was understood that in the oxynitride semiconductor thin film of this comparative example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $2\times10^{19}$ cm$^{-3}$, and the carrier mobility was 22 cm$^2$/Vsec.

Comparative Example 2

Except for employing a gas mixture of Ar and $O_2$ as the sputtering gas so that the oxygen concentration became 1.5% by volume, an oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 1. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $2\times10^{20}$ atoms/cm$^3$. From these results, it was understood that in the oxynitride semiconductor thin film of this comparative example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $3\times10^{17}$ cm$^{-3}$, and the carrier mobility was 14 cm$^2$/Vsec.

Comparative Example 3

Except for performing an annealing process in an air atmosphere for 30 minutes at 180° C., an oxynitride semiconductor thin film was obtained in the same was as in Example 5.

The oxynitride semiconductor thin film after annealing was then similarly measured using x-ray diffraction, and as a result, it was confirmed that the oxynitride semiconductor thin film was amorphous. After that, the thickness of the obtained oxynitride thin film was measured using a profilometer, and as a result, the thickness was confirmed to be 50 nm.

As described above, the oxynitride thin film of Comparative Example 3 was not crystallized, so secondary ion mass spectrometry and Hall effect measurement were not performed.

Comparative Example 4

Except for using a sintered oxide compact that includes Ga in the $In_2O_3$ at an atomic ratio of Ga/(In+Ga) of 0.25 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $1\times10^{21}$ atoms/cm$^3$. From these results, it was understood that in the oxynitride semiconductor thin film of this example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $2\times10^{14}$ cm$^{-3}$, and the carrier mobility was 4 cm$^2$/Vsec.

Comparative Example 5

Except for using a sintered oxide compact that includes Ga in the $In_2O_3$ at an atomic ratio of Ga/(In+Ga) of 0.10 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2 except that the heat treatment time was 0.5 minutes.

The oxynitride semiconductor thin film after annealing was then similarly measured using x-ray diffraction, and as a result, it was confirmed that the oxynitride semiconductor thin film was amorphous. After that, the thickness of the obtained oxynitride thin film was measured using a profilometer, and as a result, the thickness was confirmed to be 50 nm.

As described above, the oxynitride thin film of Comparative Example 5 was not crystallized, so secondary ion mass spectrometry and Hall effect measurement were not performed.

Comparative Example 6

Except for the $O_2$ concentration in the sputtering gas being 1.5% by volume and the $N_2$ concentration being 0.3% by volume, the oxynitride semiconductor thin film was obtained in the same was as in Example 5.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was crystallized, and comprised only the $In_2O_3$ phase of Bixbyite structure. Then secondary ion mass spectrometry was performed, and as a result, it was confirmed that this oxynitride semiconductor thin film included N at about $3\times10^{20}$ atoms/cm$^3$. From these results, it was understood that in the oxynitride semiconductor thin film of this comparative example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $1\times10^{19}$ cm$^{-3}$, and the carrier mobility was 24 cm$^2$/Vsec.

Comparative Example 7

Except for using a sintered oxide compact that includes Zn in the $In_2O_3$ at an atomic ratio of Zn/(In+Zn) of 0.65 as the sputtering target, the oxynitride semiconductor thin film was obtained in the same way as in Example 1.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 1. The oxynitride semiconductor thin film after annealing was then similarly measured using x-ray diffraction, and as a result, it was confirmed that the oxynitride semiconductor thin film was crystallized, and comprised the ZnO phase of Wurtzite structure. Then secondary ion mass spectrometry was performed, and as a result, it was confirmed that this oxynitride semiconductor thin film included N at about $8\times10^{20}$ atoms/cm$^3$. From these results, it was understood that in the oxynitride semiconductor thin film of this comparative example, N was solid-soluted in the $In_2O_3$ phase.

After that, the thickness of the obtained oxynitride thin film was measured using a profilometer, and as a result, the thickness was confirmed to be 50 nm. Moreover, the Hall effect of the obtained oxynitride semiconductor thin film was measured using a Hall effect measurement device, and as a result, it was confirmed that the carrier density was $6\times10^{19}$ cm$^{-3}$, and the carrier mobility was 26 cm$^2$/Vsec.

Comparative Example 8

Except for the $O_2$ concentration in the sputtering gas being 1.5% by volume and the $N_2$ concentration being 6.0% by volume, the oxynitride semiconductor thin film was obtained in the same was as in Example 5.

The composition of the metal component included in the obtained oxynitride semiconductor thin film was measured by ICP atomic emission spectrometry, and as a result, it was confirmed that the composition was nearly the same as that of the sintered oxide compact. Moreover, the crystal structure of the oxynitride semiconductor thin film was measured by x-ray diffraction, and as a result, it was confirmed that this oxynitride semiconductor thin film was amorphous.

Next, an annealing process was performed on this oxynitride semiconductor thin film under the same conditions as in Example 2. The oxynitride semiconductor thin film after annealing was then similarly measured using x-ray diffraction, and as a result, it was confirmed that the oxynitride semiconductor thin film was amorphous. After that, the thickness of the obtained oxynitride thin film was measured using a profilometer, and as a result, the thickness was confirmed to be 50 nm. Moreover, secondary ion mass spectrometry was performed, and as a result, it was confirmed that this oxynitride semiconductor thin film included N at about $2 \times 10^{22}$ atoms/$cm^3$.

As described above, the oxynitride semiconductor thin film of Comparative Example 8 was not crystallized, so Hall effect measurement was not performed.

TABLE 1

| | Film Formation $N_2$ conc. (%) | Annealing Temp. (°C.) | Annealing Time (min) | Film Thickness (nm) | Crystal Structure | Added Element (atomic ratio) | | Amount of N included (atom/$cm^{-3}$) | Carrier Density ($cm^{-3}$) | Carrier Mobility ($cm^2$/V·s) |
|---|---|---|---|---|---|---|---|---|---|---|
| Ex. 1  | 1.5 | 300 | 30  | 50  | b | —        | — | $8 \times 10^{20}$ | $5 \times 10^{16}$ | 29 |
| Ex. 2  | 1.5 | 400 | 30  | 50  | b | —        | — | $8 \times 10^{20}$ | $2 \times 10^{16}$ | 30 |
| Ex. 3  | 5.7 | 300 | 30  | 50  | b | —        | — | $5 \times 10^{21}$ | $8 \times 10^{15}$ | 27 |
| Ex. 4  | 5.7 | 400 | 30  | 50  | b | Ga(0.10) | — | $5 \times 10^{21}$ | $4 \times 10^{15}$ | 30 |
| Ex. 5  | 1.5 | 300 | 30  | 50  | b | Ga(0.10) | — | $1 \times 10^{21}$ | $7 \times 10^{14}$ | 28 |
| Ex. 6  | 1.5 | 400 | 30  | 50  | b | Ga(0.10) | — | $1 \times 10^{21}$ | $4 \times 10^{14}$ | 30 |
| Ex. 7  | 0.5 | 400 | 30  | 50  | b | Ga(0.10) | — | $4 \times 10^{20}$ | $1 \times 10^{15}$ | 28 |
| Ex. 8  | 1.5 | 400 | 120 | 50  | b | Ga(0.10) | — | $1 \times 10^{21}$ | $2 \times 10^{14}$ | 20 |
| Ex. 9  | 1.5 | 400 | 60  | 50  | b | Ga(0.10) | — | $1 \times 10^{21}$ | $3 \times 10^{14}$ | 27 |
| Ex. 10 | 1.5 | 400 | 5   | 50  | b | Ga(0.10) | — | $1 \times 10^{21}$ | $6 \times 10^{14}$ | 30 |
| Ex. 11 | 1.5 | 400 | 1   | 50  | b | Ga(0.10) | — | $1 \times 10^{21}$ | $1 \times 10^{15}$ | 30 |
| Ex. 12 | 5.7 | 300 | 30  | 50  | b | Ga(0.10) | — | $8 \times 10^{21}$ | $6 \times 10^{14}$ | 26 |
| Ex. 13 | 5.7 | 400 | 30  | 50  | b | Ga(0.10) | — | $8 \times 10^{21}$ | $3 \times 10^{14}$ | 28 |
| Ex. 14 | 1.5 | 400 | 30  | 15  | b | Ga(0.10) | — | $3 \times 10^{21}$ | $6 \times 10^{14}$ | 26 |
| Ex. 15 | 1.5 | 400 | 30  | 200 | b | Ga(0.10) | — | $8 \times 10^{20}$ | $3 \times 10^{14}$ | 29 |
| Ex. 16 | 1.5 | 400 | 30  | 50  | b | Ga(0.10) | Y(0.05)  | $4 \times 10^{21}$ | $3 \times 10^{14}$ | 27 |
| Ex. 17 | 1.5 | 400 | 30  | 50  | b | Ga(0.10) | La(0.05) | $2 \times 10^{21}$ | $2 \times 10^{14}$ | 26 |
| Ex. 18 | 1.5 | 400 | 30  | 50  | b | Ga(0.05) | — | $8 \times 10^{20}$ | $7 \times 10^{14}$ | 29 |
| Ex. 19 | 1.5 | 400 | 30  | 50  | b | Ga(0.08) | — | $9 \times 10^{20}$ | $5 \times 10^{14}$ | 29 |
| Ex. 20 | 1.5 | 400 | 30  | 50  | b | Ga(0.12) | — | $2 \times 10^{21}$ | $3 \times 10^{14}$ | 27 |
| Ex. 21 | 1.5 | 400 | 30  | 50  | b | Ga(0.15) | — | $3 \times 10^{21}$ | $2 \times 10^{14}$ | 26 |
| Ex. 22 | 1.5 | 400 | 30  | 50  | b | Ga(0.20) | — | $4 \times 10^{21}$ | $1 \times 10^{14}$ | 25 |
| Ex. 23 | 1.5 | 400 | 30  | 50  | b | Zn(0.10) | — | $9 \times 10^{20}$ | $2 \times 10^{15}$ | 12 |
| Ex. 24 | 1.5 | 400 | 30  | 50  | b | Ti(0.10) | — | $2 \times 10^{21}$ | $6 \times 10^{14}$ | 8  |
| Ex. 25 | 1.5 | 400 | 30  | 50  | b | W(0.10)  | — | $9 \times 10^{20}$ | $7 \times 10^{14}$ | 10 |
| Ex. 26 | 1.5 | 400 | 30  | 50  | b | Mg(0.10) | — | $9 \times 10^{20}$ | $1 \times 10^{15}$ | 8  |
| Ex. 27 | 1.5 | 400 | 30  | 50  | b | Al(0.10) | — | $3 \times 10^{21}$ | $8 \times 10^{14}$ | 22 |
| Ex. 28 | 1.5 | 400 | 30  | 50  | b | Y(0.10)  | — | $3 \times 10^{21}$ | $3 \times 10^{15}$ | 20 |
| Ex. 29 | 1.5 | 400 | 30  | 50  | b | La(0.10) | — | $2 \times 10^{21}$ | $1 \times 10^{15}$ | 18 |
| Ex. 30 | 1.5 | 400 | 30  | 50  | b | Sc(0.10) | — | $2 \times 10^{21}$ | $6 \times 10^{15}$ | 17 |
| Ex. 31 | 1.5 | 400 | 30  | 50  | b | Si(0.05) | — | $4 \times 10^{21}$ | $8 \times 10^{16}$ | 29 |
| Ex. 32 | 1.5 | 400 | 30  | 50  | b | Ge(0.05) | — | $2 \times 10^{21}$ | $7 \times 10^{16}$ | 31 |
| Ex. 33 | 1.5 | 400 | 30  | 50  | b | Sn(0.05) | — | $2 \times 10^{21}$ | $9 \times 10^{16}$ | 35 |
| Ex. 34 | 1.5 | 200 | 30  | 50  | b | Ga(0.10) | — | $8 \times 10^{20}$ | $9 \times 10^{16}$ | 6  |
| Ex. 35 | 1.5 | 200 | 30  | 50  | b | Ga(0.10) | — | $1 \times 10^{21}$ | $1 \times 10^{15}$ | 7  |
| CE1 | 0   | 300 | 30  | 50  | b | —        | — | $2 \times 10^{20}$ | $2 \times 10^{19}$ | 22 |
| CE2 | 0   | 300 | 30  | 50  | b | Ga(0.10) | — | $2 \times 10^{20}$ | $3 \times 10^{17}$ | 14 |
| CE3 | 1.5 | 180 | 30  | 50  | a | Ga(0.10) | — | —                  | —                  | —  |
| CE4 | 1.5 | 400 | 30  | 50  | b | Ga(0.25) | — | $1 \times 10^{21}$ | $2 \times 10^{14}$ | 4  |
| CE5 | 1.5 | 400 | 0.5 | 50  | a | Ga(0.10) | — | —                  | —                  | —  |
| CE6 | 0.3 | 400 | 30  | 50  | b | Ga(0.10) | — | $3 \times 10^{20}$ | $1 \times 10^{19}$ | 24 |
| CE7 | 1.5 | 300 | 30  | 50  | w | Zn(0.65) | — | $8 \times 10^{20}$ | $6 \times 10^{19}$ | 26 |
| CE8 | 6.0 | 400 | 30  | 50  | a | Ga(0.10) | — | $2 \times 10^{22}$ | —                  | —  |

CE) Comparative Example
*Cristal Structure - b: Bixbyite structure, w: Wurtzite structure, a; amorphous TFT Element Characteristic Evaluation Example 36

A 50 nm thick amorphous oxynitride semiconductor thin film was formed on a $SiO_2$ film of a 300 nm thick Si wafer substrate on which $SiO_2$ film was formed by thermal oxidation using a sintered oxide compact that included Ga in $In_2O_3$ at an atomic ratio Ga/(In+Ga) of 0.10 as the sputtering target.

The obtained amorphous oxynitride semiconductor thin film was crystallized by performing an annealing process in an air atmosphere for 30 minutes at 300° C., and as a result, the Si substrate, SiO$_2$ film and crystalline oxynitride semiconductor thin film were taken to be a gate electrode, gate insulation layer and channel layer, respectively.

After that, a source electrode and a drain electrode comprising an Au/Ti layered film were formed by sequentially forming a 5 nm thick Ti film and a 100 nm thick Au film on the surface of the channel layer by a direct-current magnetron sputtering method, to obtain a thin-film transistor (TFT element) having the construction illustrated in FIG. 1. The film formation conditions for the source electrode and the drain electrode were the same as the film formation conditions for the oxynitride semiconductor thin film except that the sputtering gas was only Ar, and the direct-current electric power was changed to 50 W.

Furthermore, patterning using a metal mask was performed on the source electrode and drain electrode to obtain a TFT element having a channel length of 100 μm and channel width of 450 μm.

The operating characteristics of this TFT element were investigated using a semiconductor parameter analyzer (4200SCS, manufactured by TFF Corporation Keithley Instruments), and as a result, the operating characteristics as a TFT element could be confirmed.

EXPLANATION OF REFERENCE NUMBERS

1 Gate electrode
2 Gate insulation layer
3 Channel layer
4 Source electrode
5 Drain electrode

What is claimed is:

1. An oxynitride semiconductor thin film comprising:
   a crystalline oxynitride semiconductor comprising In as a main component, O, N, and added element M, where M is one or more element selected from among Zn, Ga, Ti, Si, Ge, Sn, W, Mg, Al, Y, and rare-earth elements, the amount of added element M included in terms of atomic ratio M/(In+M) is greater than 0 but no greater than 0.20;
   a crystal structure of In$_2$O$_3$ phase of Bixbyite structure with N atoms solid-soluted in the In$_2$O$_3$ phase, the amount of N included in the crystalline oxynitride semiconductor being $3 \times 10^{20}$ atoms/cm$^3$ or more but less than $1 \times 10^{22}$ atoms/cm$^3$, and
   a carrier density of $1 \times 10^{17}$ cm$^{-3}$ or less, and
   a carrier mobility of 5 cm$^2$/Vsec or more.

2. The oxynitride semiconductor thin film according to claim 1, wherein the carrier mobility is 15 cm$^2$/Vsec or greater.

3. The oxynitride semiconductor thin film according to claim 1, wherein the carrier mobility is 25 cm$^2$/Vsec or greater.

4. The oxynitride semiconductor thin film according to claim 1, wherein the film thickness is 15 nm to 200 nm.

5. The oxynitride semiconductor thin film according to claim 1, wherein the film thickness is 40 nm to 100 nm.

6. A manufacturing method for the oxynitride semiconductor thin film comprising a step of:
   performing an annealing process at a heating temperature of 200° C. or greater, and heating time of 1 minute to 120 minutes on an amorphous oxynitride semiconductor thin film that includes In as a main component, O, N, and added element M, where M is one or more element selected from among Zn, Ga, Ti, Si, Ge, Sn, W, Mg, Al, Y, and rare-earth elements to obtain the oxynitride semiconductor thin film according to claim 1.

7. A thin-film transistor that is a thin film transistor comprising a source electrode, a drain electrode, a gate electrode, a channel layer, and a gate insulation film, wherein the channel layer comprises the oxynitride semiconductor thin film of claim 1.

* * * * *